US010862032B2

United States Patent
Rose et al.

(10) Patent No.: US 10,862,032 B2
(45) Date of Patent: Dec. 8, 2020

(54) PHASE-CHANGE MATERIAL (PCM) RADIO FREQUENCY (RF) SWITCH

(71) Applicant: Newport Fab, LLC, Newport Beach, CA (US)

(72) Inventors: Jefferson E. Rose, Hawthorne, CA (US); David J. Howard, Irvine, CA (US); Gregory P. Slovin, Irvine, CA (US); Nabil El-Hinnawy, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 16/692,296

(22) Filed: Nov. 22, 2019

(65) Prior Publication Data

US 2020/0091428 A1 Mar. 19, 2020

Related U.S. Application Data

(63) Continuation-in-part of application No. 16/574,471, filed on Sep. 18, 2019, and a continuation-in-part of application No. 16/557,577, filed on Aug. 30, 2019, and a continuation-in-part of application No. 16/550,119, filed on Aug. 23, 2019, and a
(Continued)

(51) Int. Cl.
*H01L 45/00* (2006.01)

(52) U.S. Cl.
CPC .......... *H01L 45/1608* (2013.01); *H01L 45/06* (2013.01); *H01L 45/1286* (2013.01); *H01L 45/143* (2013.01); *H01L 45/144* (2013.01); *H01L 45/1675* (2013.01)

(58) Field of Classification Search
None
See application file for complete search history.

(56) References Cited

U.S. PATENT DOCUMENTS

| 6,535,545 B1 | 3/2003 | Ben-Bassat |
| 7,522,029 B1 | 4/2009 | Lantz |
| | (Continued) | |

FOREIGN PATENT DOCUMENTS

| WO | WO 2016/028362 | 2/2016 |

OTHER PUBLICATIONS

G. Slovin, et al., "Design Criteria in Sizing Phase-Change RF Switches," in *IEEE Transactions on Microwave Theory and Techniques*, vol. 65, No. 11, pp. 4531-4540, Nov. 2017.
(Continued)

*Primary Examiner* — Evren Seven
(74) *Attorney, Agent, or Firm* — Farjami & Farjami LLP

(57) ABSTRACT

A radio frequency (RF) switch includes a heating element, thermally conductive and electrically insulating layer over the heating element, a wetting dielectric layer over the thermally conductive and electrically insulating layer, and a phase-change material (PCM) over the wetting dielectric layer. At least one cladding dielectric layer can be situated over sides and/or over a top surface of the PCM. Each of the wetting dielectric layer, phase change material, and cladding dielectric layer can comprise at least germanium. A transitional dielectric layer can be situated between the thermally conductive and electrically insulating layer and the wetting dielectric layer. A contact uniformity support layer can be situated over the cladding dielectric layer.

20 Claims, 13 Drawing Sheets

Related U.S. Application Data continuation-in-part of application No. 16/546,211, filed on Aug. 20, 2019, and a continuation of application No. 16/267,719, filed on Feb. 5, 2019, now Pat. No. 10,454,027, and a continuation-in-part of application No. 16/185,620, filed on Nov. 9, 2018, now Pat. No. 10,615,338, and a continuation-in-part of application No. 16/163,881, filed on Oct. 18, 2018, and a continuation-in-part of application No. 16/161,960, filed on Oct. 16, 2018, now Pat. No. 10,644,235, and a continuation-in-part of application No. 16/114,106, filed on Aug. 27, 2018, and a continuation of application No. 16/103,587, filed on Aug. 14, 2018, now Pat. No. 10,461,253, and a continuation of application No. 16/103,646, filed on Aug. 14, 2018, now Pat. No. 10,475,993, and a continuation of application No. 16/103,490, filed on Aug. 14, 2018, now Pat. No. 10,476,001.

(56) References Cited

U.S. PATENT DOCUMENTS

| | | |
|---|---|---|
| 8,314,983 B2 | 11/2012 | Frank |
| 2,014,181 A1 | 7/2014 | Moon |
| 9,257,647 B2 | 2/2016 | Borodulin |
| 9,362,492 B2 | 6/2016 | Goktepeli |
| 9,368,720 B1 | 6/2016 | Moon |
| 9,444,430 B1 | 9/2016 | Abdo |
| 9,601,545 B1 | 3/2017 | Tu |
| 9,640,759 B1 | 5/2017 | Curioni |
| 9,891,112 B1 | 2/2018 | Abel |
| 9,917,104 B1 | 3/2018 | Roizin |
| 10,128,243 B2 | 11/2018 | Yoo |
| 10,164,608 B2 | 12/2018 | Belot |
| 10,461,253 B1 | 10/2019 | Slovin |
| 10,505,106 B1 | 12/2019 | Joshi et al. |
| 10,529,922 B1 | 1/2020 | Howard |
| 2005/0127348 A1 | 6/2005 | Horak |
| 2006/0246712 A1 | 11/2006 | Kim |
| 2007/0075347 A1 | 4/2007 | Lai |
| 2007/0246766 A1 | 10/2007 | Liu |
| 2008/0142775 A1 | 6/2008 | Chen |
| 2008/0142777 A1* | 6/2008 | Park .................... H01L 45/1691 257/4 |
| 2008/0272355 A1* | 11/2008 | Cho ...................... H01L 45/124 257/2 |
| 2008/0291718 A1 | 11/2008 | Liu |
| 2009/0065761 A1 | 3/2009 | Chen |
| 2010/0084626 A1 | 4/2010 | Delhougne |
| 2010/0238720 A1 | 9/2010 | Tio Castro |
| 2010/0246247 A1 | 9/2010 | Kim |
| 2011/0097825 A1* | 4/2011 | Cheng ................. H01L 45/1226 438/14 |
| 2011/0291784 A1 | 12/2011 | Nakatsuji |
| 2012/0037872 A1 | 2/2012 | Ikarashi |
| 2013/0187120 A1 | 7/2013 | Redaelli |
| 2013/0285000 A1 | 10/2013 | Arai |
| 2014/0110657 A1 | 4/2014 | Redaelli |
| 2014/0191181 A1 | 7/2014 | Moon |
| 2014/0264230 A1 | 9/2014 | Borodulin |
| 2014/0339610 A1 | 11/2014 | Rashed |
| 2015/0048424 A1 | 2/2015 | Tien |
| 2015/0090949 A1 | 4/2015 | Chang |
| 2015/0333131 A1 | 11/2015 | Mojumder |
| 2016/0035973 A1 | 2/2016 | Raieszadeh |
| 2016/0056373 A1 | 2/2016 | Goktepeli |
| 2016/0308507 A1 | 10/2016 | Engelen |
| 2017/0092694 A1 | 3/2017 | BrightSky |
| 2017/0126205 A1 | 5/2017 | Lin |
| 2017/0187347 A1 | 6/2017 | Rinaldi |
| 2017/0207764 A1 | 7/2017 | Wang |
| 2017/0243861 A1 | 8/2017 | Wang |
| 2017/0365427 A1 | 12/2017 | Borodulin |
| 2018/0005786 A1 | 1/2018 | Navarro |
| 2018/0138894 A1 | 5/2018 | Belot |
| 2018/0194615 A1 | 7/2018 | Nawaz |
| 2018/0266974 A1 | 9/2018 | Khosravani |
| 2018/0269393 A1 | 9/2018 | Zhang |
| 2019/0064555 A1 | 2/2019 | Hosseini |
| 2019/0067572 A1 | 2/2019 | Tsai |
| 2019/0088721 A1 | 3/2019 | Reig |
| 2019/0165264 A1 | 5/2019 | Wu |
| 2019/0172657 A1 | 6/2019 | Zhu |
| 2019/0267214 A1 | 8/2019 | Liu |
| 2019/0296718 A1 | 9/2019 | Birkbeck |

OTHER PUBLICATIONS

N. El-Hinnawy et al., "A 7.3 THz Cut-Off Frequency, Inline, Chalcogenide Phase-Change RF Switch Using an Independent Resistive Heater for Thermal Actuation," *2013 IEEE Compound Semiconductor Integrated Circuit Symposium (CSICS)*, Monterey, CA, 2013, pp. 1-4.

G. Slovin, et al. "AlN Barriers for Capacitance Reduction in Phase-Change RF Switches," in *IEEE Electron Device Letters*, vol. 37, No. 5, pp. 568-571, May 2016.

\* cited by examiner

PHASE-CHANGE MATERIAL (PCM) RADIO FREQUENCY (RF) SWITCH

CLAIMS OF PRIORITY

The present application is a continuation-in-part of and claims the benefit of and priority to application Ser. No. 16/574,471 filed on Sep. 18, 2019, titled "Phase-Change Material RF Switch," which is in turn a continuation of and claims the benefit of and priority to application Ser. No. 16/103,490 filed on Aug. 14, 2018, titled "Manufacturing RF Switch. Based on Phase-Change Material,". The present application is also a continuation-in-part of and claims the benefit of and priority to application Ser. No. 16/546,211 filed on Aug. 20, 2019, titled "High Reliability RF Switch Based on Phase-Change Material," which is in turn a continuation of and claims the benefit of and priority to application Ser. No. 16/103,587 filed on Aug. 14, 2018, titled "Design for High Reliability RF Switch Based on Phase-Change Material,". The present application is also a continuation-in-part of and claims the benefit of and priority to application Ser. No. 16/557,577 filed on Aug. 30, 2019, titled "Method of Manufacturing PCM RF Switch," which is in turn a continuation of and claims the benefit of and priority to application Ser. No. 16/103,646 filed on Aug. 14, 2018, titled "PCM RF Switch Fabrication with Subtractively Formed Heater,". The present application is further a continuation-in-part of and claims the benefit of and priority to application Ser. No. 16/114,106 filed on Aug. 27, 2018, titled "Fabrication of Contacts in an RF Switch Having a Phase-Change Material (PCM) and a Heating Element,". The present application is also a continuation-in-part of and claims the benefit of and priority to application Ser. No. 16/161,960 filed on Oct. 16, 2018, titled "Phase-Change Material (PCM) Radio Frequency (RF) Switch with Reduced Parasitic Capacitance,". In addition, the present application is a continuation-in-part of and claims the benefit of and priority to application Ser. No. 16/163,881 filed on Oct. 18, 2018, titled "Phase-Change Material (PCM) Radio Frequency (RF) Switch Using a Chemically Protective and Thermally Conductive Layer,". Furthermore, the present application is a continuation-in-part of and claims the benefit of and priority to application Ser. No. 16/185,620 filed on Nov. 9, 2018, titled "Phase-Change Material (PCM) Contacts with Slot Lower Portions and Contact Dielectric for Reducing Parasitic Capacitance and Improving Manufacturability in PCM RF Switches,". Moreover, the present application is a continuation-in-part of and claims the benefit of and priority to application Ser. No. 16/550,119 filed on Aug. 23, 2019, titled "Phase-Change Material (PCM) Radio Frequency (RF) Switches," which is in turn a continuation of and claims the benefit of and priority to application Ser. No. 16/267,719 filed on Feb. 5, 2019, titled "Phase-Change Material (PCM) Radio Frequency (RF) Switches with Stressor Layers and Contact Adhesion Layers,". The disclosures and contents of all of the above-identified applications are hereby incorporated fully by reference into the present application.

BACKGROUND

Phase-change materials (PCM) are capable of transforming from a crystalline phase to an amorphous phase. These two solid phases exhibit differences in electrical properties, and semiconductor devices can advantageously exploit these differences. Given the ever-increasing reliance on radio frequency (RF) communication, there is particular need for RF switching devices to exploit phase-change materials. However, the capability of phase-change materials for phase transformation depends heavily on how they are exposed to thermal energy and how they are allowed to release thermal energy. For example, in order to transform into an amorphous state, phase-change materials may need to achieve temperatures of approximately seven hundred degrees Celsius (700° C.) or more, and may need to cool down within hundreds of nanoseconds.

In a PCM RF switch, the phase change material can be subjected to high temperatures, both during back-end-of-line (BEOL) processing and also as a result of OFF/ON cycling during operation of the PCM RF switch. Despite being subjected to these high temperatures, it is crucial for PCM to remain well-adhered to layers below and above it, otherwise various defects may result. Further, dielectric layers situated below and above the PCM, in addition to the requirement to adhere well to the PCM, should have characteristics that prevent the PCM to form agglomerations, voids and/or delaminations. Such defects reduce the reliability of the PCM RF switch and may cause the switch to fail. Accordingly, accommodating PCM in RF switches can present significant design challenges.

Thus, there is a need in the art for a highly reliable phase-change material (PCM) RF switch that overcomes the disadvantages in the art.

SUMMARY

The present disclosure is directed to phase-change material (PCM) radio frequency (RF) switches, substantially as shown in and/or described in connection with at least one of the figures, and as set forth in the claims.

DETAILED DESCRIPTION

Figure 1:
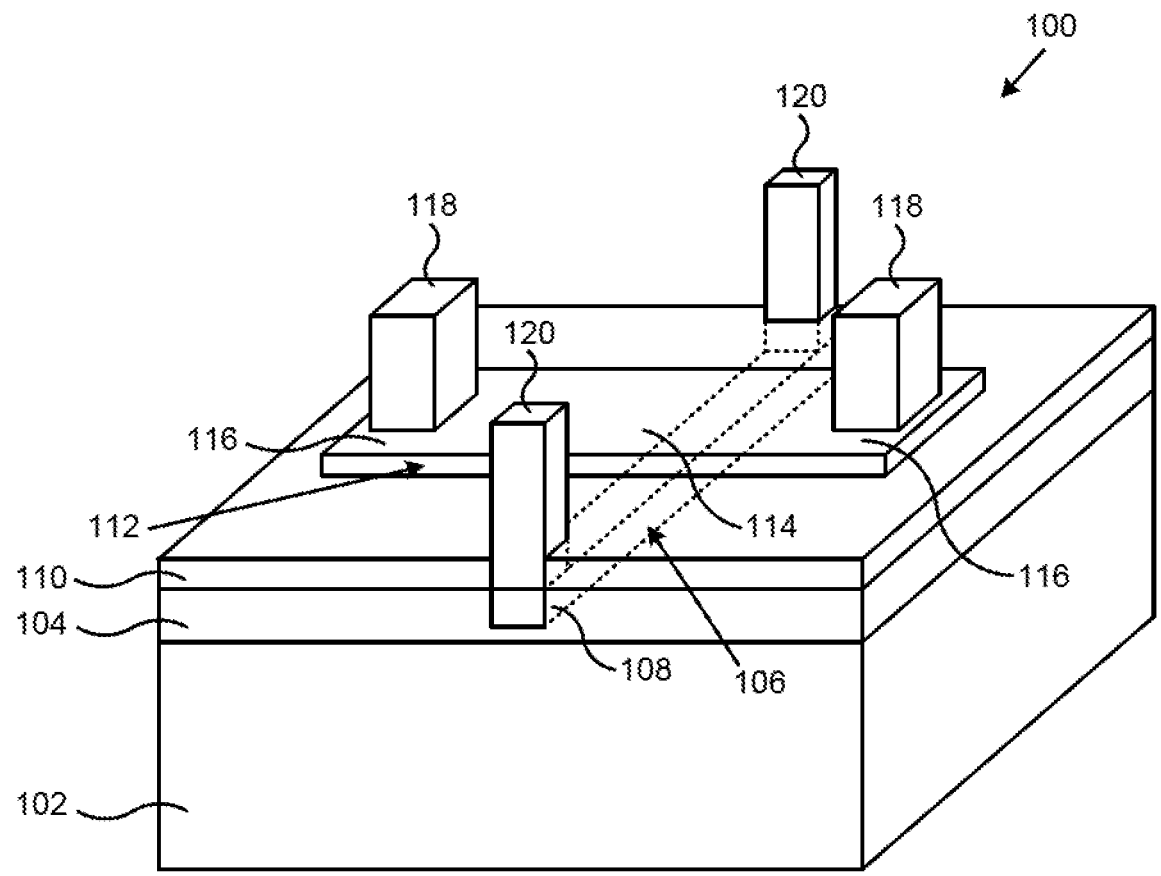
FIG. 1 illustrates a perspective view of a portion of phase-change material (PCM) RF switch.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 illustrates a perspective view of a portion of phase-change material (PCM) RF switch. As shown in FIG. 1, PCM RF switch 100 includes substrate 102, lower dielectric 104, heating element 106 having terminal segments 108, thermally conductive and electrically insulating layer 110, PCM 112 having active segment 114 and passive segments 116, PCM contacts 118, and heater contacts 120. For purposes of illustration, the perspective view in FIG. 1 shows selected structures of PCM RF switch 100. PCM RF switch 100 may include other structures not shown in FIG. 1.

Substrate 102 is situated under lower dielectric 104. In various implementations, substrate 102 is a silicon (Si), silicon-on-insulator (SOI), sapphire, complementary metal-oxide-semiconductor (CMOS), bipolar CMOS (BiCMOS), or group III-V substrate. In one implementation, substrate 102 is an insulator, such as silicon dioxide ($SiO_2$). In various implementations, substrate 102 includes a heat spreader or substrate 102 itself performs as a heat spreader. Substrate 102 can have additional layers (not shown in FIG. 1). In one implementation, substrate 102 can comprise a plurality of interconnect metal levels and interlayer dielectric layers. Substrate 102 can also comprise a plurality of devices, such as integrated passive devices (not shown in FIG. 1).

Lower dielectric 104 in PCM RF switch 100 is situated above substrate 102 and below thermally conductive and electrically insulating layer 110. As shown in FIG. 1, lower dielectric 104 is also adjacent to sides of heating element 106. Lower dielectric 104 extends along the width of PCM RF switch 100, and is also coplanar with the top of heating element 106. Because PCM RF switch 100 includes lower dielectric 104 on the sides of heating element 106, less heat transfers horizontally (i.e., from the sides) and more heat dissipates vertically, from heating element 106 toward active segment 114 of PCM 112. In various implementations, lower dielectric 104 can have a relative width and/or a relative thickness greater or less than shown in FIG. 1. Lower dielectric 104 can comprise any material with thermal conductivity less than that of thermally conductive and electrically insulating layer 110. In one implementation, lower dielectric 104 comprises $SiO_2$.

Heating element 106 in PCM RF switch 100 is situated in lower dielectric 104. Heating element 106 also approximately defines active segment 114 of PCM 112. Heating element 106 generates a crystallizing heat pulse or an amorphizing heat pulse for transforming active segment 114 of PCM 112. Heating element 106 can comprise any material capable of Joule heating. Heating element 106 can be connected to electrodes of a pulser (not shown in FIG. 1) that generates voltage or current pulses. Preferably, heating element 106 comprises a material that exhibits minimal or substantially no electromigration, thermal stress migration, and/or agglomeration. In various implementations, heating element 106 can comprise tungsten (W), molybdenum (Mo), titanium (Ti), titanium tungsten (TiW), titanium nitride (TiN), tantalum (Ta), tantalum nitride (TaN), nickel chromium (NiCr), or nickel chromium silicon (NiCrSi). For example, in one implementation, heating element 106 comprises tungsten lined with titanium and titanium nitride.

Thermally conductive and electrically insulating layer 110 in PCM RF switch 100 is situated on top of heating element 106 and lower dielectric 104, and under PCM 112 and, in particular, under active segment 114 of PCM 112. Thermally conductive and electrically insulating layer 110 ensures efficient heat transfer from heating element 106 toward active segment 114 of PCM 112, while electrically insulating heating element 106 from PCM contacts 118, PCM 112, and other neighboring structures.

Thermally conductive and electrically insulating layer 110 can comprise any material with high thermal conductivity and high electrical resistivity. In various implementations, thermally conductive and electrically insulating layer 110 can comprise silicon carbide ($Si_XC_Y$), aluminum nitride ($Al_XN_Y$), aluminum oxide ($Al_XO_Y$), beryllium oxide ($Be_XO_Y$), diamond, or diamond-like carbon. In one implementation, thermally conductive and electrically insulating layer 110 can be a nugget that does not extend along the width of PCM RF switch 6. For example, thermally conductive and electrically insulating layer 110 can be a nugget approximately aligned with heating element 106.

PCM 112 in PCM RF switch 100 is situated on top of thermally conductive and electrically insulating layer 110. PCM RF switch 100 utilizes PCM 112 to transfer input RF signals in an ON state and to block input RF signals in an OFF state. PCM 112 includes active segment 114 and passive segments 116. Active segment 114 of PCM 112 is approximately defined by heating element 106. Passive segments 116 of PCM 112 extend outward and are transverse to heating element 106, and are situated approximately under PCM contacts 118. As used herein, "active segment" refers to a segment of PCM that transforms between crystalline and amorphous phases, for example, in response to a crystallizing or an amorphizing heat pulse generated by heating element 106, whereas "passive segment" refers to a segment of PCM that does not make such transformation and maintains a crystalline phase (i.e., maintains a conductive state).

With proper heat pulses and heat dissipation, active segment 114 of PCM 112 can transform between crystalline and amorphous phases, allowing PCM RF switch 100 to switch between ON and OFF states respectively. Active segment 114 of PCM 112 must be heated and rapidly quenched in order for PCM RF switch 100 to switch states. If active segment 114 of PCM 112 does not quench rapidly enough, it will not transform. and PCM RF switch 100 will fail to switch states. How rapidly active segment 114 of PCM 112 must be quenched depends on the material, volume, and temperature of PCM 112. In one implementation, the quench time window can be approximately one hundred nanoseconds (100 ns) or greater or less.

PCM 112 can comprise germanium telluride ($Ge_XTe_Y$), germanium antimony telluride ($Ge_XSb_YTe_Z$). germanium selenide ($Ge_XSe_Y$), or any other chalcogenide. In various implementations, PCM 112 can be germanium telluride having from forty percent to sixty percent germanium by composition (i.e., $Ge_XTe_Y$, where $0.45 \leq X \leq 0.6$ and $Y=1-X$). The material for PCM 112 can be chosen based upon ON state resistivity, OFF state electric field breakdown voltage, crystallization temperature, melting temperature. or other considerations. It is noted that in FIG. 1, heating element 106 is transverse to PCM 112. Heating element 106 is illustrated with dashed lines as seen through various structures of PCM RF switch 100. Current flowing in heating element 106 flows approximately under active segment 114 of PCM 112.

PCM contacts 118 in PCM RF switch 100 are connected to passive segments 116 of PCM 112. Similarly, heater contacts 120 are connected to terminal segments 108 of heating element 106. PCM contacts 118 provide RF signals to and from PCM 112. Heater contacts 120 provide power to heating element 106 for generating a crystallizing heat pulse or an amorphizing heat pulse. In various implementations, PCM contacts 118 and heater contacts 120 can comprise tungsten (W), copper (Cu), or aluminum (Al). PCM contacts 118 and heater contacts 120 can extend through various dielectric layers (not shown in FIG. 1).

Figure 2:
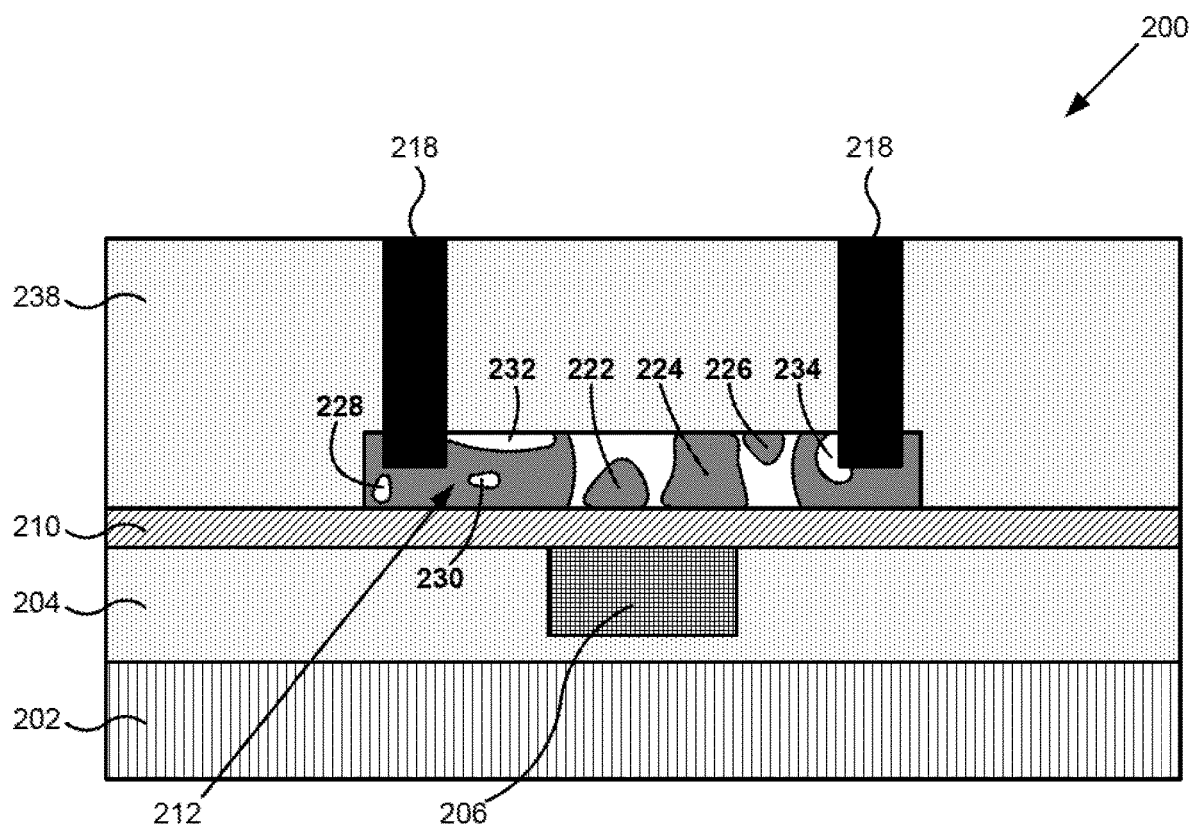
FIG. 2 illustrates a cross-sectional view of a portion of a PCM RF switch corresponding to the PCM RF switch of FIG. 1.

FIG. 2 illustrates a cross-sectional view of a portion of a PCM RF switch corresponding to the PCM RF switch of FIG. 1. As shown in FIG. 2, PCM RF switch 200 includes substrate 202, lower dielectric 204, heating element 206, thermally conductive and electrically insulating layer 210, PCM 212, PCM contacts 218, and interlayer dielectric 238. PCM 212 is situated over thermally conductive and electrically insulating layer 210, and interlayer dielectric 238 is situated over PCM 212. PCM contacts 218 extend into PCM 212. PCM RF switch 200 in FIG. 2 generally corresponds to PCM RF switch 100 in FIG. 1, and may have any implementations and advantages described above.

Absent the teachings of the present application, PCM 212 includes defects 222, 224, 226, 228, 230, 232, and 234. Defects 222, 224, and 226 represent agglomeration or beading of PCM 212 into separate masses. Defects 228 and 230 represent voids left by diffused PCM 212. Defects 232 and 234 represent delamination of PCM 212. In particular, defect 232 represents delamination of interlayer dielectric 238 and PCM 212, and defect 234 represents delamination of one of PCM contacts 218 and PCM 212. Delamination of interlayer dielectric 238 and PCM contacts 218 is more likely to occur where PCM 212 has voids near its interfaces with interlayer dielectric 238 and PCM contacts 218. It is noted that PCM 212 can also delaminate from thermally conductive and electrically insulating layer 210.

Defects 222, 224, 226, 228, 230, 232, and 234 occur when PCM 212 is subjected to high temperatures, such as during back-end-of-line (BEOL) processing used to form metallizations and other structures over PCM RF switch 200, or during normal OFF/ON cycling operations. Due to defects such as defects 222, 224, 226, 228, 230, 232, and 234, PCM 212 does not adhere well to thermally conductive and electrically insulating layer 210 or to interlayer dielectric 238 when subjected to these high temperatures. Defects 222, 224, 226, 228, 230, 232, and 234 result in several disadvantages for RF switch 200, including higher ON state resistance ($R_{ON}$), inability to transform active segment 114 (shown in FIG. 1) of PCM 212, physical and electrical damage to structures, etc. Accordingly, defects and poor adhesion of PCM 212 when subjected to high temperatures is a significant problem that can reduce the reliability of PCM RF switch 200, and can cause PCM RF switch 200 to fail.

Figure 3:
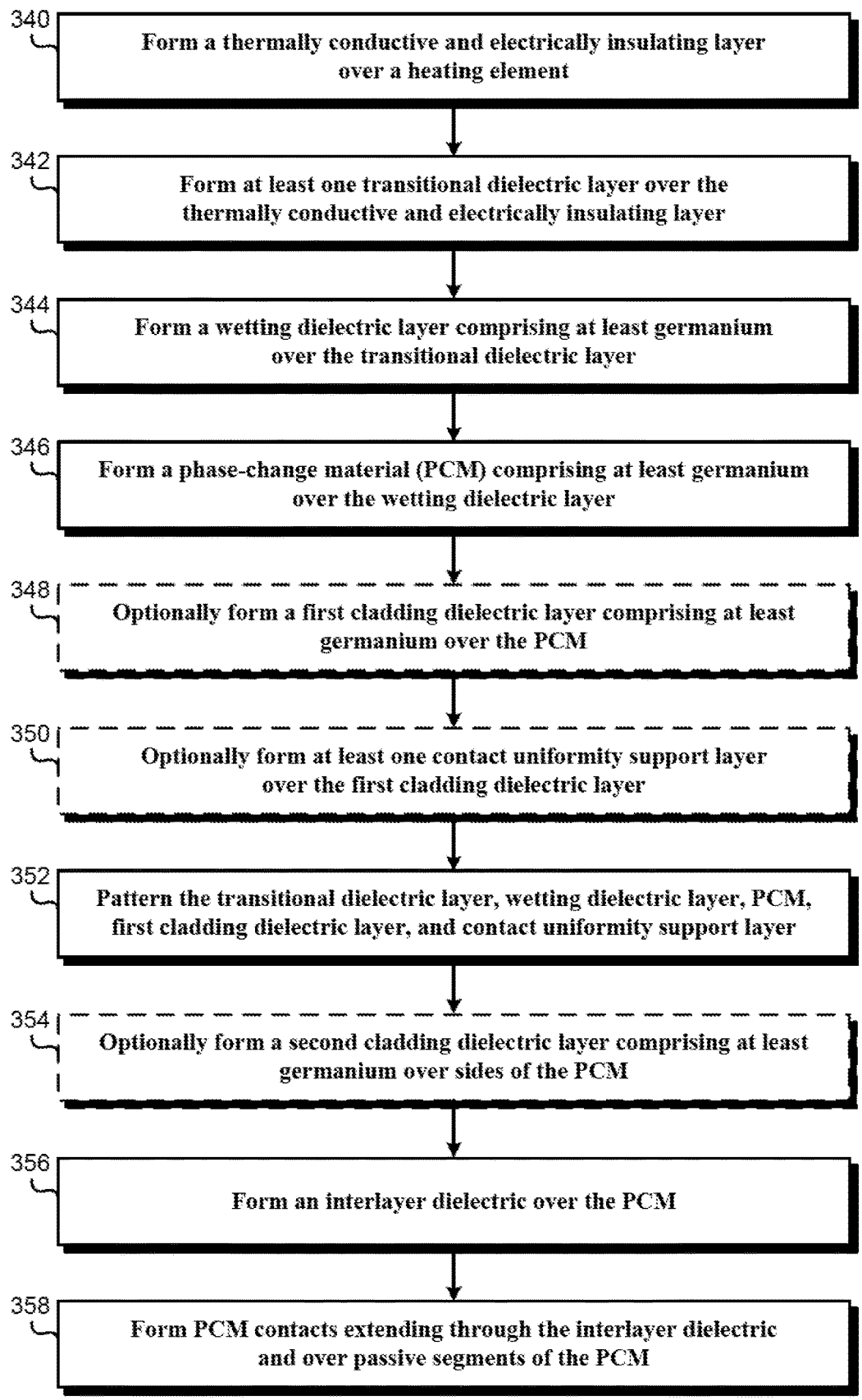
FIG. 3 illustrates a portion of a flowchart of an exemplary method for manufacturing a PCM RF switch according to one implementation of the present application.
Figure 4A:
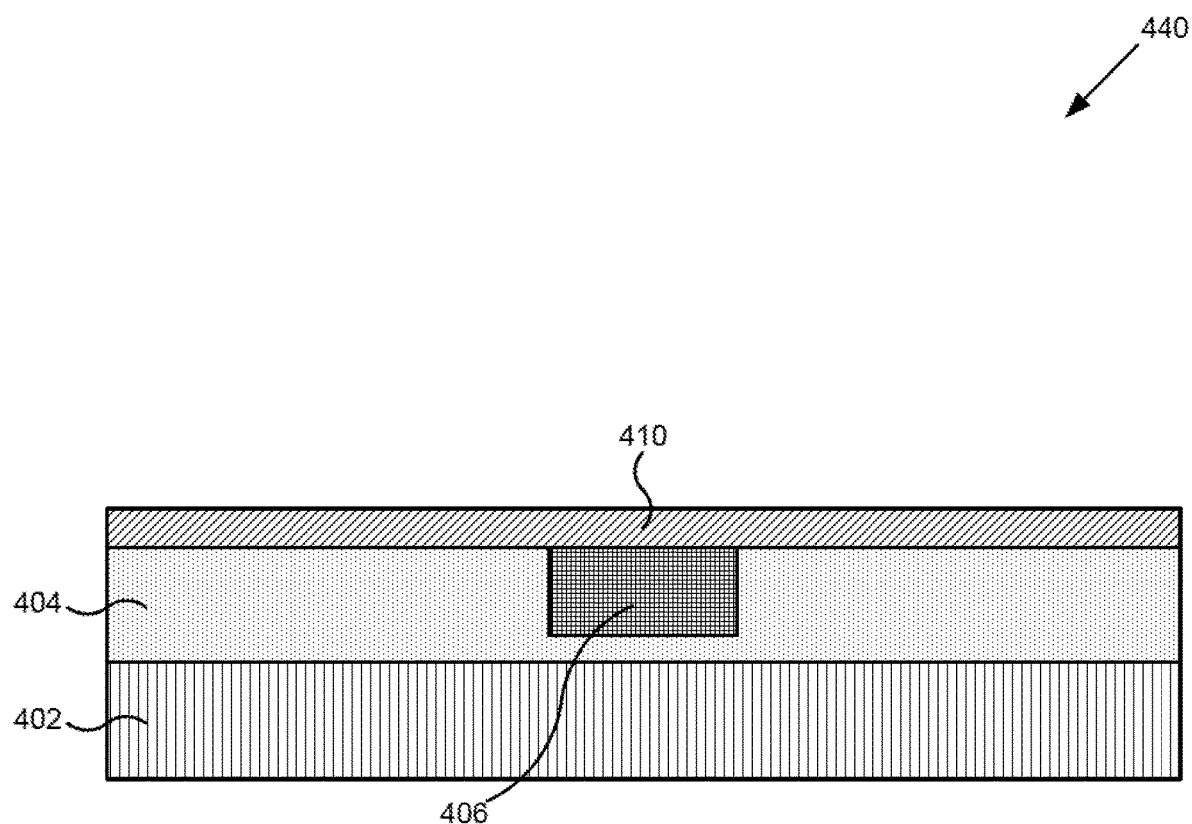
FIG. 4A illustrates a cross-sectional view of a portion of a PCM RF switch structure processed in accordance with the flowchart of FIG. 3 according to one implementation of the present application.
Figure 4B:
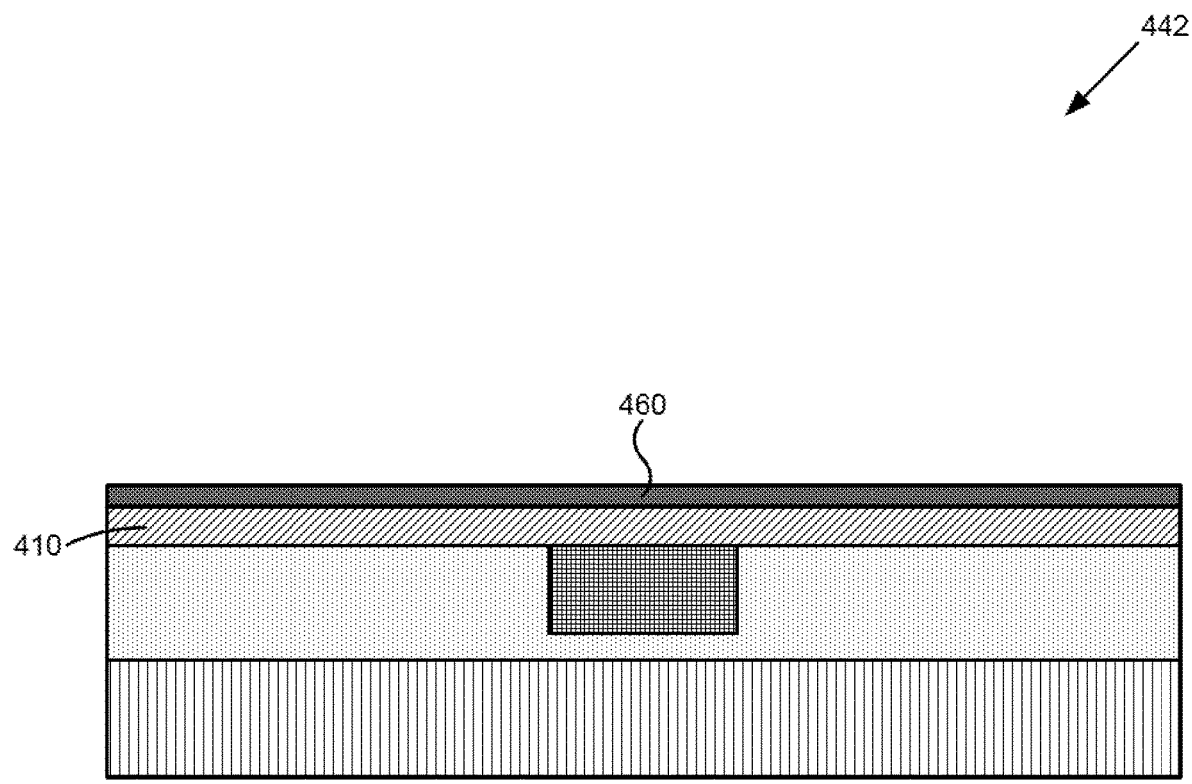
FIG. 4B illustrates a cross-sectional view of a portion of a PCM RF switch structure processed in accordance with the flowchart of FIG. 3 according to one implementation of the present application.

FIG. 3 illustrates a portion of a flowchart of an exemplary method for manufacturing a PCM RF switch according to one implementation of the present application. Structures shown in FIGS. 4A through 4J illustrate the results of performing actions 340 through 358 shown in the flowchart of FIG. 3. For example, FIG. 4A shows a PCM RF switch structure after performing action 340 in FIG. 3, FIG. 4B shows a PCM RF switch structure after performing action 342 in FIG. 3, and so forth.

Actions 340 through 358 shown in the flowchart of FIG. 3 are sufficient to describe one implementation of the present inventive concepts. Other implementations of the present inventive concepts may utilize actions different from those shown in the flowchart of FIG. 3. Certain details and features have been left out of the flowchart of FIG. 3 that are apparent to a person of ordinary skill in the art. For example, an action may consist of one or more sub-actions or may involve specialized equipment or materials, as known in the art. Moreover, some actions, such as masking and cleaning actions, are omitted so as not to distract from the illustrated actions.

FIG. 4A illustrates a cross-sectional view of a portion of a PCM RF switch structure processed in accordance with action 340 in the flowchart of FIG. 3 according to one implementation of the present application. As shown in FIG. 4A, in PCM RF switch structure 440, thermally conductive and electrically insulating layer 410 is formed over heating element 406. PCM RF switch structure 440 in FIG. 4A includes substrate 402, lower dielectric 404, heating element 406, and thermally conductive and electrically insulating layer 410, which generally correspond to substrate 202, lower dielectric 204, heating element 206, and thermally conductive and electrically insulating layer 210 in FIG. 2, and may have any implementations and advantages described above.

Heating element 406 is situated in lower dielectric 404. In one implementation, heating element 406 can be formed by depositing heating element 406 in a trench in lower dielectric 404, as disclosed in U.S. patent application Ser. No. 16/103,490 filed on Aug. 14, 2018, titled "Manufacturing RF Switch Based on Phase-Change Material." In another implementation, heating element 406 can be formed using a subtractive-etching method, as disclosed in U.S. patent application Ser. No. 16/103,646 filed on Aug. 14, 2018, titled "PCM RF Switch Fabrication with Subtractively Formed Heater." The disclosures and contents of the above-identified applications are incorporated fully by reference into the present application. As described above, in various implementations, heating element 406 can comprise tungsten (W), molybdenum (Mo), titanium (Ti), titanium tungsten (TiW), titanium nitride (TiN), tantalum (Ta), tantalum nitride (TaN), nickel chromium (NiCr), or nickel chromium silicon (NiCrSi).

Thermally conductive and electrically insulating layer 410 in PCM RF switch structure 440 is formed on top of heating element 406 and lower dielectric 404. Thermally conductive and electrically insulating layer 410 can be deposited, for example, by physical vapor deposition (PVD), chemical vapor deposition (CVD), or plasma enhanced chemical vapor deposition (PECVD). In one implementation, thermally conductive and electrically insulating layer 410 can have a thickness of approximately five hundred angstroms to approximately five thousand angstroms (500 Å-5000 Å). As described above, in various implementations, thermally conductive and electrically insulating layer 410 can comprise silicon carbide ($Si_XC_Y$), aluminum nitride ($Al_XN_Y$), aluminum oxide ($Al_XO_Y$), beryllium oxide ($Be_XO_Y$), diamond, or diamond-like carbon.

FIG. 4B illustrates a cross-sectional view of a portion of a PCM RF switch structure processed in accordance with action 342 in the flowchart of FIG. 3 according to one implementation of the present application. As shown in FIG. 4B, in PCM RF switch structure 442, transitional dielectric layer 460 is formed over thermally conductive and electrically insulating layer 410. As described below, transitional dielectric layer 460 passivates thermally conductive and electrically insulating layer 410 during formation of a "wetting dielectric layer" in a subsequent action. Transitional dielectric layer 460 can be deposited, for example, by PECVD or high density plasma CVD (HDP-CVD). In various implementations, transitional dielectric layer 460 can comprise silicon nitride ($Si_XN_Y$) or silicon oxide ($Si_XO_Y$). In one implementation, transitional dielectric layer 460 is a bi-layer that comprises oxide and nitride, such as $Si_XO_Y$ under $Si_XN_Y$. In one implementation, transitional dielectric layer 460 can have a thickness of approximately ten angstroms to approximately one hundred angstroms (10 Å-100 Å).

Figure 4C:
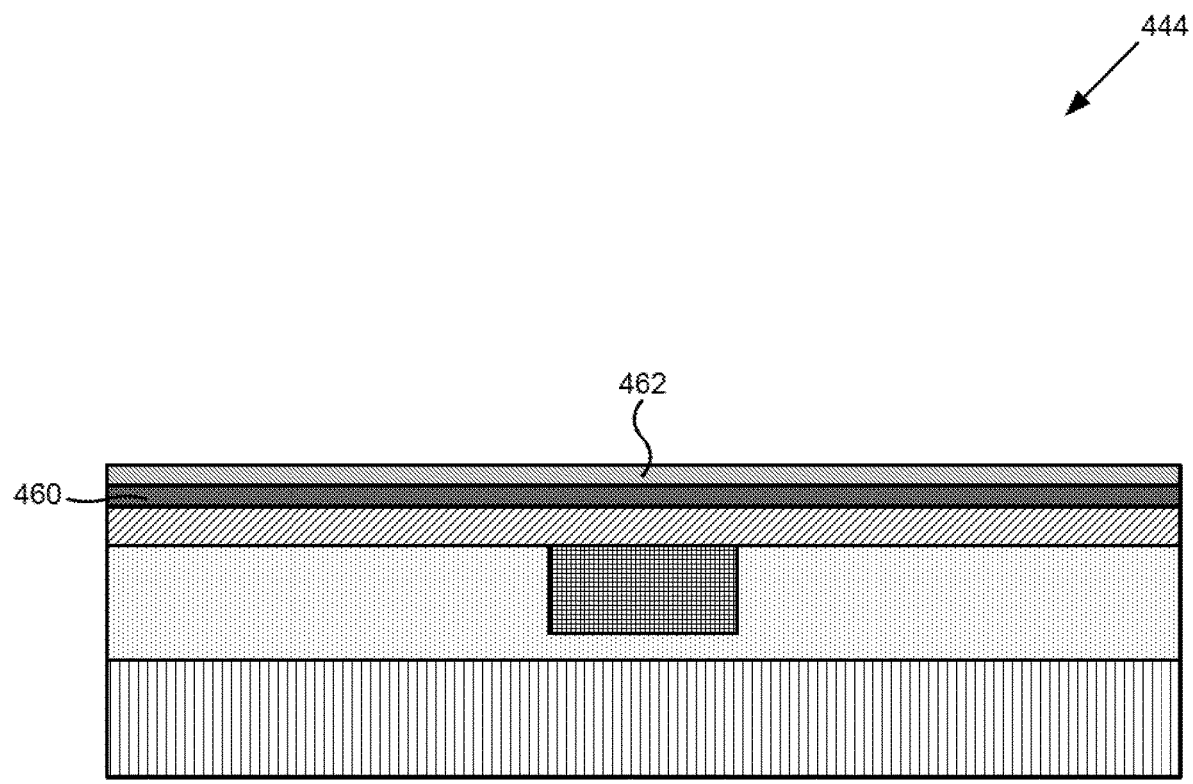
FIG. 4C illustrates a cross-sectional view of a portion of a PCM RF switch structure processed in accordance with the flowchart of FIG. 3 according to one implementation of the present application.

FIG. 4C illustrates a cross-sectional view of a portion of a PCM RF switch structure processed in accordance with action 344 in the flowchart of FIG. 3 according to one implementation of the present application. As shown in FIG. 4C, in PCM RF switch structure 444, wetting dielectric layer 462 is formed over transitional dielectric layer 460. As described below, wetting dielectric layer 462 significantly reduces the number and size of defects, such as defects 222, 224, 226, 228, 230, 232, and 234 (shown in FIG. 2), in a PCM formed in a subsequent action and after being subjected to high temperatures.

Wetting dielectric layer 462 is a dielectric comprising at least one shared component material with a PCM formed in a subsequent action. For example, in one implementation where the PCM comprises germanium, wetting dielectric layer 462 can comprise germanium oxide ($Ge_XO_Y$), germanium nitride ($Ge_XN_Y$), germanium oxynitride ($Ge_XO_YN_Z$), germanium silicon oxide ($Ge_XSi_YO_Z$), germanium silicon nitride ($Ge_XSi_YN_Z$), or germanium silicon oxynitride ($Ge_WSi_XO_YN_Z$). In another implementation where the PCM comprises tellurium, wetting dielectric layer 462 can comprise tellurium oxide ($Te_XO_Y$), tellurium nitride ($Te_XN_Y$), or tellurium oxynitride ($Te_XO_YN_Z$).

The composition of wetting dielectric layer 462 can be chosen at least partly based on its effectiveness in reducing defects. For example, where a PCM formed in a subsequent action comprises germanium, a higher composition of germanium in wetting dielectric layer 462 will significantly reduce defects, but will increase the chance that germanium in wetting dielectric layer 462 will slip into and undesirably alter the composition of the PCM. In various implementations, in order to avoid undesirably altering the composition of the subsequently formed PCM while still significantly reducing defects, wetting dielectric layer 462 can be germanium oxide having from fifty percent to one hundred percent more oxygen than germanium by composition (i.e., $Ge_XO_Y$, where $1.5X \le Y \le 2.0X$).

Wetting dielectric layer 462 can be formed using a variety of techniques. In one implementation, wetting dielectric layer 462 is formed by PECVD to deposit wetting dielectric layer 462 from a gas state to a solid state on transitional dielectric layer 460. In another implementation wetting dielectric layer 462 is formed by reactive PVD (sputtering) using a solid germanium target, a reactive gas, such as oxygen or nitrogen, and an inert gas, such as argon. In another implementation, wetting dielectric layer 462 is formed by surface implanting germanium in an oxide or nitride layer. In another implementation, wetting dielectric layer 462 is formed by spin coating a solution containing germanate that adheres to transitional dielectric layer 460. In another implementation, wetting dielectric layer 462 is formed by heating PCM RF switch structure 444 and flowing a gaseous mixture including at least germanium hydride ($Ge_XH_Y$). In this implementation, plasma cracking can also be used. In one implementation wetting dielectric layer 462 can have a thickness of approximately ten angstroms to approximately one hundred angstroms (10 Å-100 Å).

As described above, transitional dielectric layer 460 passivates thermally conductive and electrically insulating layer 410 before formation of wetting dielectric layer 462. For example, where thermally conductive and electrically insulating layer 410 comprises aluminum nitride ($Al_XN_Y$), forming wetting dielectric layer 462 directly over thermally conductive and electrically insulating layer 410 could release aluminum. The released aluminum could interface with PCM formed in a subsequent action, creating paths for electrical conduction and undesirably lowering an OFF state resistance ($R_{OFF}$) of a PCM RF switch. As shown in FIG. 4C, because transitional dielectric layer 460 is situated over thermally conductive and electrically insulating layer 410, component materials in thermally conductive and electrically insulating layer 410 are not released during formation of wetting dielectric layer 462.

Figure 4D:
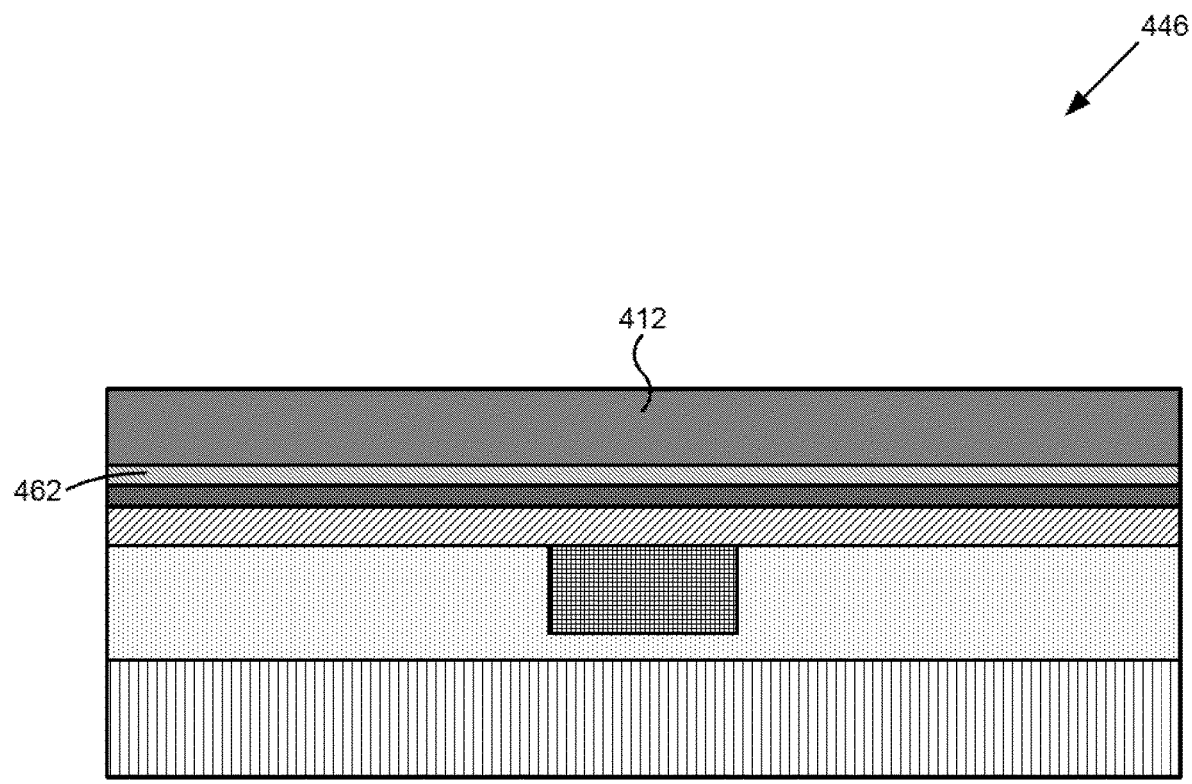
FIG. 4D illustrates a cross-sectional view of a portion of a PCM RF switch structure processed in accordance with the flowchart of FIG. 3 according to one implementation of the present application.

FIG. 4D illustrates a cross-sectional view of a portion of a PCM RF switch structure processed in accordance with action 346 in the flowchart of FIG. 3 according to one implementation of the present application. As shown in FIG. 4D, in PCM RF switch structure 446, PCM 412 is formed over wetting dielectric layer 462. As described above, with proper heat pulses and heat dissipation, PCM 412 can transform between crystalline and amorphous phases, allowing a PCM RF switch to switch between ON and OFF states respectively. PCM 412 can be deposited, for example, by reactive PVD, CVD, evaporation, or atomic layer deposition (ALD). In one implementation, PCM 412 can have a thickness of approximately five hundred angstroms to approximately two thousand angstroms (500 Å-2000 Å). In other implementations, PCM 412 can have any other thicknesses. The thickness of PCM 412 can be chosen based upon sheet resistance, crystallization power, amorphization power, or other considerations.

According to the present application. PCM 412 comprises at least one shared component material with wetting dielectric layer 462. For example, in one implementation, both PCM 412 and wetting dielectric layer 462 comprise germanium. In various implementations, PCM 412 can comprise germanium telluride ($Ge_XTe_Y$), germanium antimony telluride ($Ge_XSb_YTe_Z$), germanium selenide ($Ge_XSe_Y$), or any other chalcogenide. In various implementations, PCM 412 can be germanium telluride having from forty percent to sixty percent germanium by composition (i.e., $Ge_XTe_Y$, where $0.4 \le X \le 0.6$ and $Y=1-X$).

Figure 4E:
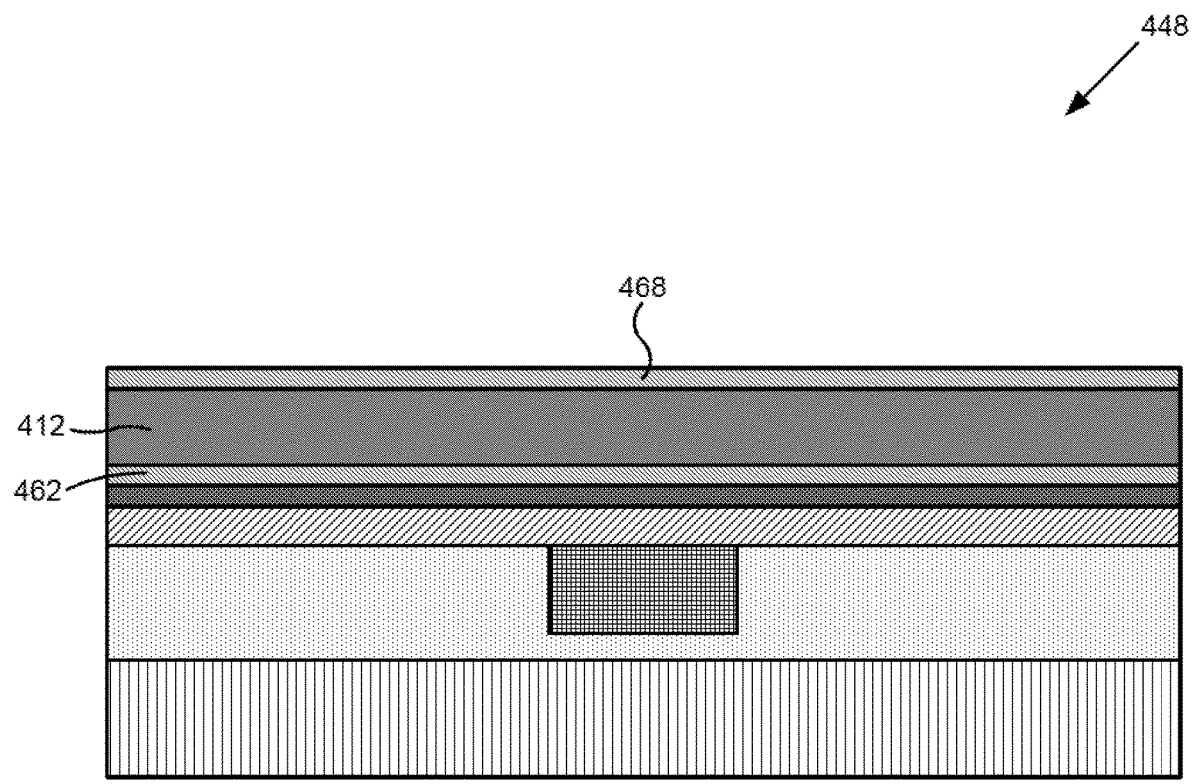
FIG. 4E illustrates a cross-sectional view of a portion of a PCM RF switch structure processed in accordance with the flowchart of FIG. 3 according to one implementation of the present application.

FIG. 4E illustrates a cross-sectional view of a portion of a PCM RF switch structure processed in accordance with optional action 348 in the flowchart of FIG. 3 according to one implementation of the present application. As shown in FIG. 4E, in PCM RF switch structure 448, cladding dielectric layer 468 is formed over PCM 412. As described below, cladding dielectric layer 468 significantly reduces the number and size of defects, such as defects 222, 224, 226, 228, 230, 232, and 234 (shown in FIG. 2), in PCM 412 after being subjected to high temperatures.

Similar to wetting dielectric layer 462, cladding dielectric layer 468 is a dielectric comprising at least one shared component material with PCM 412. For example, in one implementation where PCM 412 comprises germanium, cladding dielectric layer 468 can comprise germanium oxide ($Ge_XO_Y$), germanium nitride ($Ge_XN_Y$), germanium oxynitride ($Ge_XO_YN_Z$), germanium silicon oxide ($Ge_XSi_YO_Z$), germanium silicon nitride ($Ge_XSi_YN_Z$), or germanium silicon oxynitride ($Ge_WSi_XO_YN_Z$). In another implementation where PCM comprises tellurium, cladding dielectric layer 468 can comprise tellurium oxide ($Te_XO_Y$), tellurium nitride ($Te_XN_Y$), or tellurium oxynitride ($Te_XO_YN_Z$). In various implementations, in order to avoid undesirably altering the composition of PCM 412 while still significantly reducing defects, cladding dielectric layer 468 can be germanium oxide having from fifty percent to one hundred percent more oxygen than germanium by composition (i.e., $Ge_XO_Y$, where $1.5 \leq X \leq Y \leq 2.0X$). In one implementation, cladding dielectric layer 468 can have a thickness of approximately ten angstroms to approximately one hundred angstroms (10 Å-100 Å).

Any of the techniques described above for forming wetting dielectric layer 462 that do not damage or substantially alter PCM 412 can be used to form cladding dielectric layer 468. In various implementations, cladding dielectric layer 468 is formed by PECVD, reactive PVD, or spin coating. Surface implanting techniques and flowing a gaseous mixture including germanium hydride ($Ge_XH_Y$) can risk damaging or substantially altering PCM 412. Methods such as reactive PVD can be done in-situ, after deposition of the PCM, such that inadvertent oxidation due to exposure to ambient conditions is not incurred. Cladding dielectric layer 468 is considered optional in that PCM RF switches according to the present application can be formed without cladding dielectric layer 468.

Figure 4F:
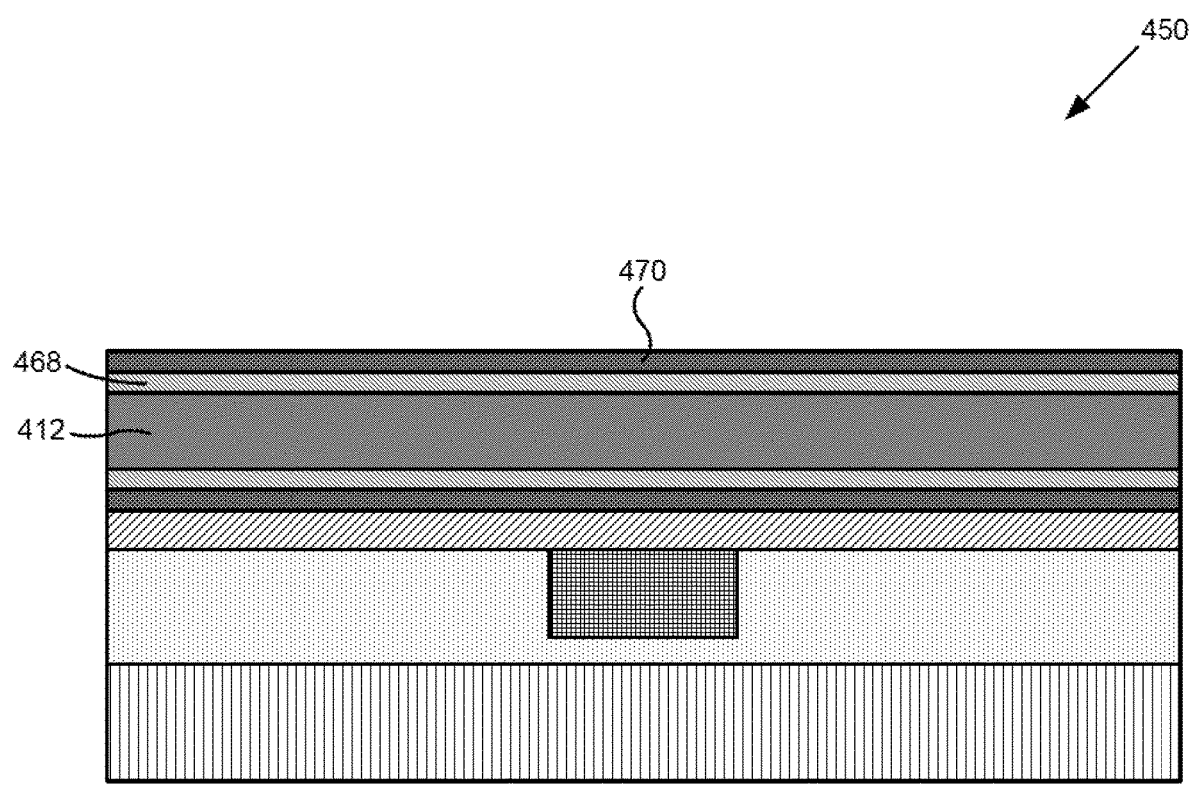
FIG. 4F illustrates a cross-sectional view of a portion of a PCM RF switch structure processed in accordance with the flowchart of FIG. 3 according to one implementation of the present application.

FIG. 4F illustrates a cross-sectional view of a portion of a PCM RF switch structure processed in accordance with optional action 350 in the flowchart of FIG. 3 according to one implementation of the present application. As shown in FIG. 4F, in PCM RF switch structure 450, contact uniformity support layer 470 is formed over cladding dielectric layer 468. As described below, contact uniformity support layer 470 enables PCM contacts formed in a subsequent action to uniformly contact passive segments of PCM 412. Contact uniformity support layer 470 can be deposited, for example, by PECVD or HDP-CVD. In various implementations, contact uniformity support layer 470 can comprise silicon nitride ($Si_XN_Y$) or silicon oxide ($Si_XO_Y$). In one implementation, contact uniformity support layer 470 is a bi-layer that comprises oxide and nitride, such as $Si_XO_Y$ under $Si_XN_Y$. In one implementation. contact uniformity support layer 470 can have a thickness of approximately ten angstroms to approximately one hundred angstroms (10 Å-100 Å). Contact uniformity support layer 470 is considered optional in that PCM RF switches according to the present application can be formed without contact uniformity support layer 470.

Figure 4G:
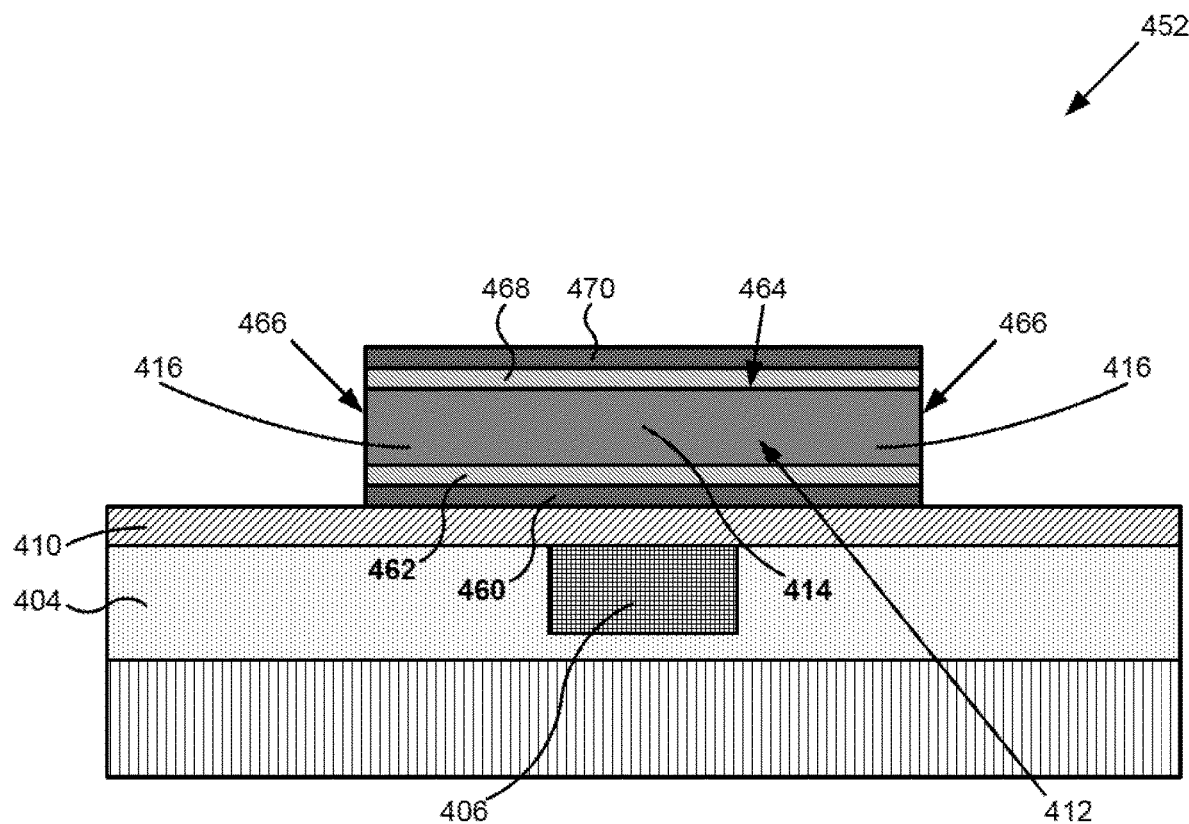
FIG. 4G illustrates a cross-sectional view of a portion of a PCM RF switch structure processed in accordance with the flowchart of FIG. 3 according to one implementation of the present application.

FIG. 4G illustrates a cross-sectional view of a portion of a PCM RF switch structure processed in accordance with action 352 in the flowchart of FIG. 3 according to one implementation of the present application. As shown in FIG. 4G, in PCM RF switch structure 452, transitional dielectric layer 460, wetting dielectric layer 462, PCM 412, cladding dielectric layer 468 (in case cladding dielectric layer 468 is used), and contact uniformity support layer 470 (in case contact uniformity support layer 470 is used) are patterned. Outer segments of transitional dielectric layer 460, wetting dielectric layer 462, PCM 412, cladding dielectric layer 468, and contact uniformity support layer 470 are removed. Although wetting dielectric layer 462 is situated under PCM 412 and cladding dielectric layer 468 is situated over top surface 464 of PCM 412, sides 466 of PCM 412 exposed.

In one implementation, a patterning mask (not shown in FIG. 4G) is formed over contact uniformity support layer 470; and outer segments of transitional dielectric layer 460, wetting dielectric layer 462, PCM 412, cladding dielectric layer 468, and contact uniformity support layer 470 are etched away in regions outside of the mask; and then the mask is removed. In one implementation, a fluorine-based plasma dry etch is used to selectively etch transitional dielectric layer 460, wetting dielectric layer 462, PCM 412, cladding dielectric layer 468, and contact uniformity support layer 470, and thermally conductive and electrically insulating layer 410 performs as an etch stop, as disclosed in U.S. patent application Ser. No. 16/163,881 filed on Oct. 18, 2018, titled "Phase-Change Material (PCM) Radio Frequency (RF) Switch Using a Chemically Protective and Thermally Conductive Layer." In PCM RF switch structure 452, active segment 414 of PCM 412 approximately overlies heating element 406, and passive segments 416 of PCM 412 approximately overlie lower dielectric 404.

Figure 4H:
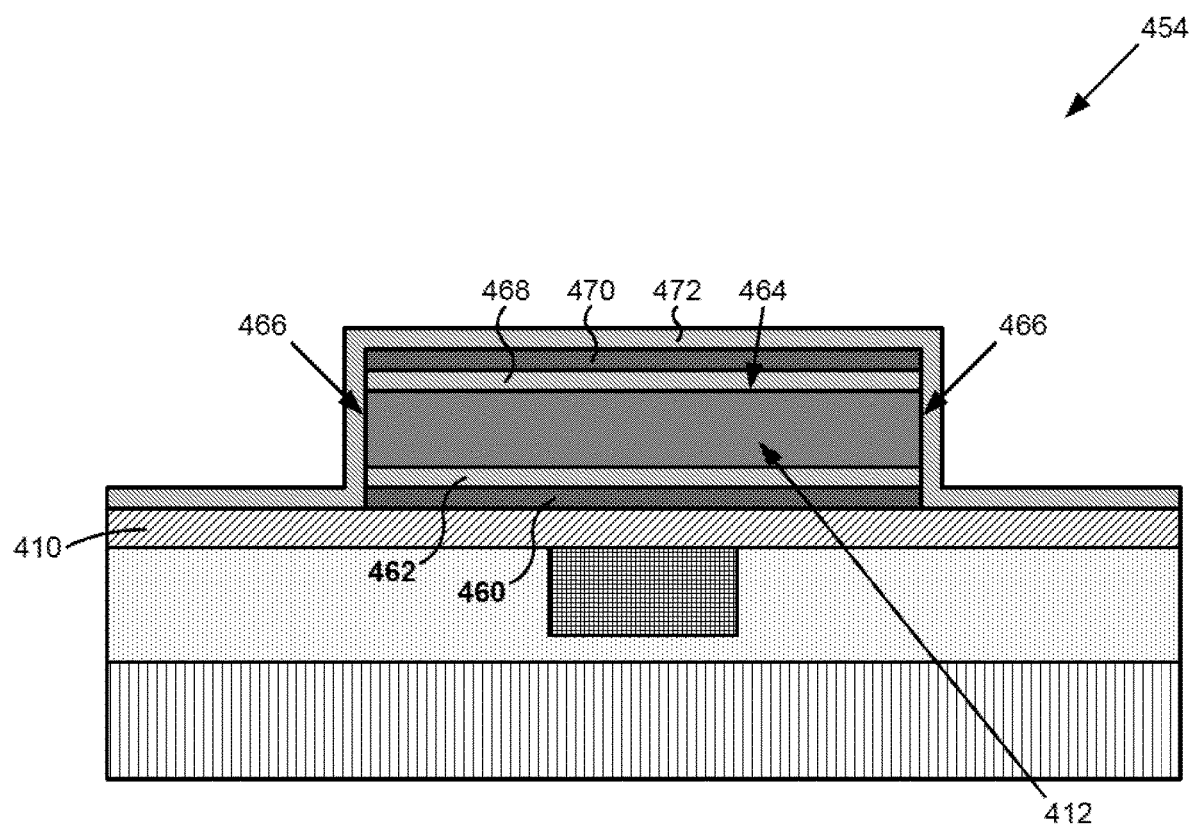
FIG. 4H illustrates a cross-sectional view of a portion of a PCM RF switch structure processed in accordance with the flowchart of FIG. 3 according to one implementation of the present application.

FIG. 4H illustrates a cross-sectional view of a portion of a PCM RF switch structure processed in accordance with optional action 354 in the flowchart of FIG. 3 according to one implementation of the present application. As shown in FIG. 4H, in PCM RF switch structure 454, cladding dielectric layer 472 is formed over sides 466 of PCM 412. Cladding dielectric layer 472 is also formed over contact uniformity support layer 470, over sides of transitional dielectric layer 460, wetting dielectric layer 462, cladding dielectric layer 468, and contact uniformity support layer 470, and over segments of the top surface of thermally conductive and electrically insulating layer 410. Any of the techniques described above for forming cladding dielectric layer 468 can be used to form cladding dielectric layer 472. Notably, cladding dielectric layer 472 is situated on sides 466 of PCM 412 between wetting dielectric layer 462 and cladding dielectric layer 468, thereby encapsulating PCM 412. As described above cladding dielectric layer 472 significantly reduces the number and size of defects, such as defects 222, 224, 226, 228, 230, 232, and 234 (shown in FIG. 2), in PCM 412 after being subjected to high temperatures.

Cladding dielectric layer 472 is considered optional in that PCM RF switches according to the present application can be formed without cladding dielectric layer 472. In one implementation, cladding dielectric layer 468 and contact uniformity support layer 470 are not used, and instead cladding dielectric layer 472 is formed over top surface 464 of PCM 412 and over sides 466 of PCM 412. In this implementation, a contact uniformity support layer may be formed over cladding dielectric layer 472.

Figure 4I:
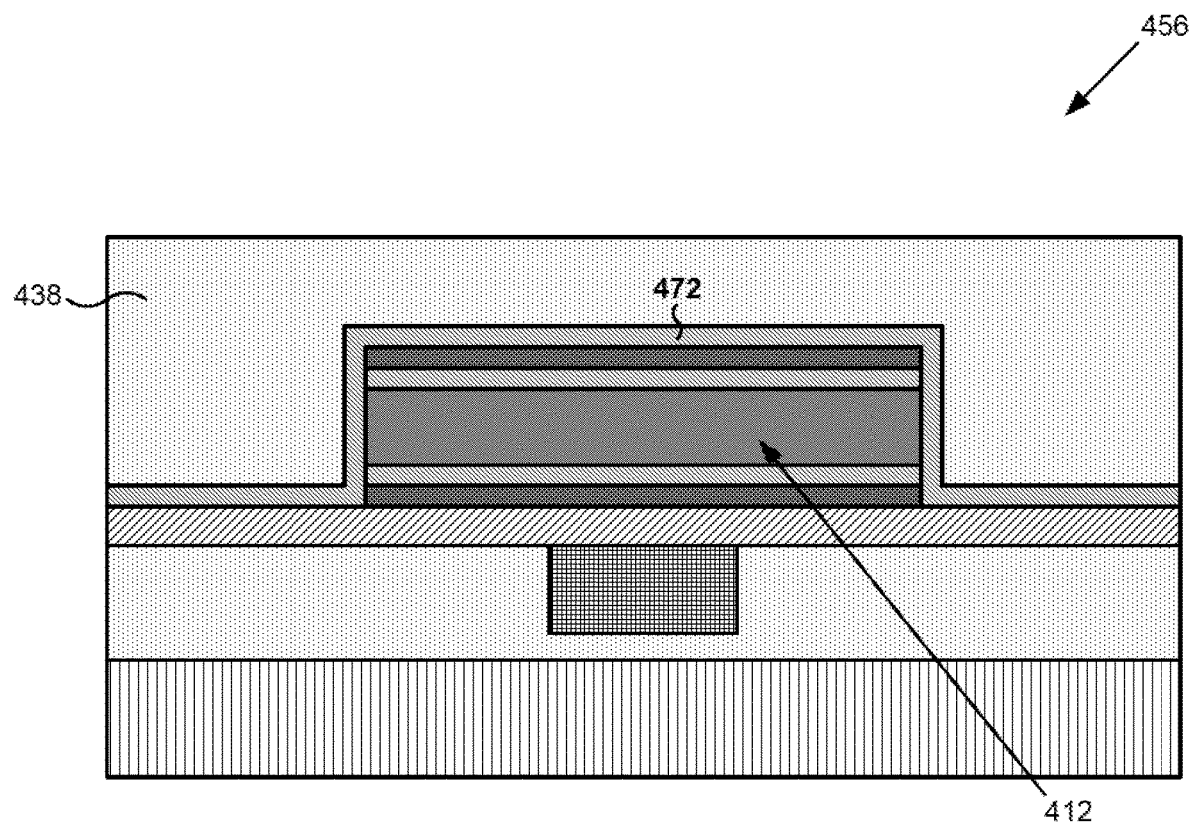
FIG. 4I illustrates a cross-sectional view of a portion of a PCM RF switch structure processed in accordance with the flowchart of FIG. 3 according to one implementation of the present application.

FIG. 4I illustrates a cross-sectional view of a portion of a PCM RF switch structure processed in accordance with action 356 in the flowchart of FIG. 3 according to one implementation of the present application. As shown in FIG. 4I, in PCM RF switch structure 456, interlayer dielectric 438 is formed over PCM 412 and over cladding dielectric layer 472 (in case cladding dielectric layer 472 is used). In various implementations, interlayer dielectric 438 is $SiO_2$, boron-doped $SiO_2$, phosphorous-doped $SiO_2$, $Si_XN_Y$, or another dielectric. In various implementations, interlayer dielectric 438 is a low-k dielectric, such as fluorinated silicon dioxide, carbon-doped silicon oxide, or spin-on organic polymer. Interlayer dielectric 438 can be formed, for example, by PECVD, HDP-CVD, or spin-on processes. In the present implementation, interlayer dielectric 438 is planarized, for example, using chemical machine polishing (CMP). In one implementation, a thickness of interlayer dielectric 438 is significantly greater than a thickness of contact uniformity support layer 470. In one implementation, a thickness of interlayer dielectric 438 can range from approximately one half a micron to approximately two microns (0.5 µm-2 µm).

Figure 4J:
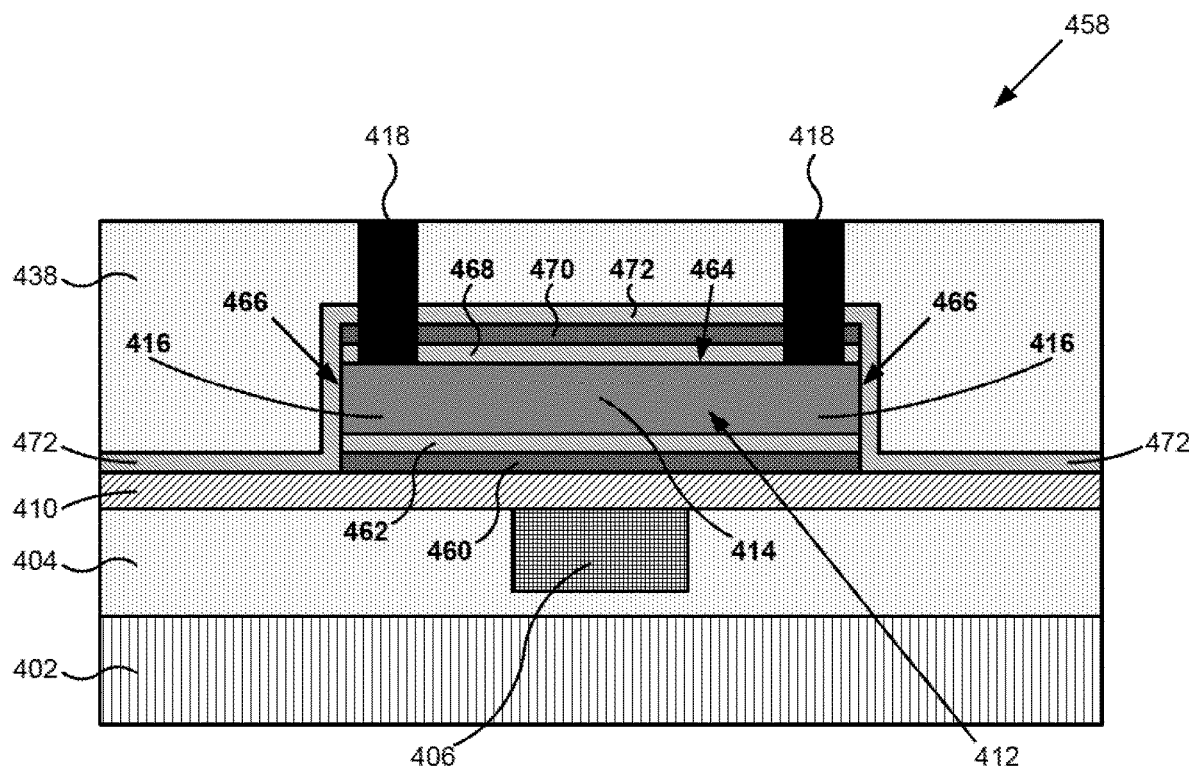
FIG. 4J illustrates a cross-sectional view of a portion of a PCM RF switch structure processed in accordance with the flowchart of FIG. 3 according to one implementation of the present application.

FIG. 4J illustrates a cross-sectional view of a portion of a PCM RF switch structure processed in accordance with action 358 in the flowchart of FIG. 3 according to one implementation of the present application. As shown in FIG. 4J, in PCM RF switch structure 458, PCM contacts 418 are formed. PCM contacts 418 extend through interlayer dielectric 438, and through contact uniformity support layer 470 and cladding dielectric layers 468 and 472 (in case contact uniformity support layer 470 and cladding dielectric layers 468 and 472 are used). PCM contacts 418 are situated over passive segments 416 of PCM 412.

In one implementation, holes are aggressively etched in interlayer dielectric 438 and cladding dielectric layer 472 while contact uniformity support layer 470 performs as an etch stop, then contact uniformity support layer 470 and cladding dielectric layer 468 are punch-through etched to stop at top surface 464 of PCM 412, then PCM contacts 418 are formed using a metal layer deposition or a damascene process, as disclosed in U.S. patent application Ser. No. 16/185,620 filed on Nov. 9, 2018, titled "Phase-Change Material (PCM) Contacts with Slot Lower Portions and Contact Dielectric for Reducing Parasitic Capacitance and Improving Manufacturability in PCM RF Switches." The disclosure and content of the above-identified application are incorporated fully by reference into the present application. In various implementations, PCM contacts 418 can comprise W, Al, or Cu. As described above, contact uniformity support layer 470 enables PCM contacts 418 to uniformly contact passive segments 416 of PCM 412 at top surface 464 of PCM 412.

Additional metallizations can be situated over PCM contacts 418, however, the cross-sectional view in FIG. 4J generally corresponds to a substantially complete PCM RF switch. Accordingly, PCM RF switch structure 458 may also be referred to as PCM RF switch 458 in the present application. Substantially complete PCM RF switch 458 includes substrate 402, lower dielectric 404, heating element 406, thermally conductive and electrically insulating layer 410, transitional dielectric layer 460, wetting dielectric layer 462, PCM 412 having active segment 414, passive segments 416, sides 466, and top surface 464, cladding dielectric layers 468 and 472, contact uniformity support layer 470, interlayer dielectric 438, and PCM contacts 418.

By utilizing the methods and structures disclosed in the present application, PCM RF switch 458 with improved performance can be reliably manufactured. Compared to PCM 212 in FIG. 2, PCM 412 in FIG. 4J experiences significantly reduced number and size of defects. Because PCM 412 is situated over wetting dielectric layer 462 comprising at least one shared component material, rather than over thermally conductive and electrically insulating layer 210 as shown in FIG. 2, the contact angle (or wetting angle) between PCM 412 and wetting dielectric layer 462 is reduced, and PCM 412 adheres well to wetting dielectric layer 462. After PCM 412 is subjected to high temperatures, PCM 412 would not experience significant defects, such as defects 222, 224, 226, 228, 230, 232, and 234 (shown in FIG. 2). Thus, PCM RF switch 458 is suitable for use with BEOL processes using high temperatures, and PCM RF switch 458 does not degrade during normal OFF/ON cycling, when heating element 406 generates heat pulses.

Cladding dielectric layers 468 and 472 further cause PCM 412 to experience significantly reduced number and size of defects. Because cladding dielectric layers 468 and 472 are situated over top surface 464 and sides 466 of PCM 412, wetting dielectric layer 462 and cladding dielectric layers 468 and 472 together encapsulate PCM 412 in material that PCM 412 adheres well to, further reducing defects. Moreover, where wetting dielectric layer 462 and cladding dielectric layers 468 and 472 are relatively thin compared to PCM 412, they do not significantly impede the thermal performance of PCM 412. Active segment 414 of PCM 412 can still be heated by heat pulses from heating element 406, and active segment 414 of PCM 412 can still quench rapidly enough to switch between ON and OFF states.

Thus, various implementations of the present application achieve a highly reliable PCM RF switch that overcomes the deficiencies in the art. From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A radio frequency (RF) switch comprising:
a heating element;
a thermally conductive and electrically insulating layer situated over said heating element;
a wetting dielectric layer comprising at least germanium situated over said thermally conductive and electrically insulative layer;
at least one transitional dielectric layer situated between said thermally conductive and electrically insulating layer and said wetting dielectric layer;
a phase-change material (PCM) comprising at least germanium situated over said wetting dielectric layer.

2. The RF switch of claim 1, wherein said wetting dielectric layer comprises a material selected from the group consisting of germanium oxide ($Ge_XO_Y$), germanium nitride ($Ge_XN_Y$), germanium oxynitride ($Ge_XO_YN_Z$), germanium silicon oxide ($Ge_XSi_YO_Z$), germanium silicon nitride ($Ge_XSi_YN_Z$), and germanium silicon oxynitride ($Ge_WSi_XO_YN_Z$).

3. The RF switch of claim 1, further comprising a cladding dielectric layer comprising at least germanium situated over a top surface of said PCM.

4. The RF switch of claim 1, further comprising a cladding dielectric layer comprising at least germanium situated over sides of said PCM.

5. The RF switch of claim 3, wherein said cladding dielectric layer comprises a material selected from the group consisting of germanium oxide ($Ge_XO_Y$), germanium nitride ($Ge_XN_Y$), germanium oxynitride ($Ge_XO_YN_Z$), germanium silicon oxide ($Ge_XSi_YO_Z$), germanium silicon nitride ($Ge_XSi_YN_Z$), and germanium silicon oxynitride ($Ge_WSi_XO_YN_Z$).

6. The RF switch of claim 3, further comprising at least one contact uniformity support layer situated over said cladding dielectric layer.

7. The RF switch of claim 6, wherein said at least one contact uniformity support layer comprises a material selected from the group consisting of silicon nitride ($Si_XN_Y$) and silicon oxide ($Si_XO_Y$).

8. The RF switch of claim 1, wherein said least one transitional dielectric layer comprises a material selected from the group consisting of silicon nitride ($Si_XN_Y$) and silicon oxide ($Si_XO_Y$).

9. The RF switch of claim 1, wherein said thermally conductive and electrically insulating layer comprises a material selected from the group consisting of silicon carbide ($Si_XC_Y$), aluminum nitride ($Al_XN_Y$), aluminum oxide ($Al_XO_Y$), beryllium oxide ($Be_XO_Y$), diamond, and diamond-like carbon.

10. The RF switch of claim 1, wherein said PCM is selected from the group consisting of germanium telluride ($Ge_XTe_Y$), germanium antimony telluride ($Ge_XSb_YTe_Z$), germanium selenide ($Ge_XSe_Y$), and any other chalcogenide.

11. A radio frequency (RF) switch comprising:
a heating element;
a thermally conductive and electrically insulating layer situated over said heating element;
a transitional dielectric layer situated over said thermally conductive and electrically insulating layer, said transitional dielectric layer comprising a material selected from the group consisting of silicon nitride ($Si_XN_Y$) and silicon oxide ($Si_XO_Y$);
a wetting dielectric layer situated over said transitional dielectric layer, said wetting dielectric layer comprising a material selected from the group consisting of germanium oxide ($Ge_XO_Y$), germanium nitride ($Ge_XN_Y$), germanium oxynitride ($Ge_XO_YN_Z$), germanium silicon oxide ($Ge_XSi_YO_Z$), germanium silicon nitride ($Ge_XSi_YN_Z$), and germanium silicon oxynitride ($Ge_WSi_XO_YN_Z$);
a phase-change material (PCM) comprising at least germanium situated over said wetting dielectric layer;
a cladding dielectric layer situated over a top surface of said PCM, said cladding dielectric layer comprising a material selected from the group consisting of $Ge_XO_Y$, $Ge_XN_Y$, $Ge_XO_YN_Z$, $Ge_XSi_YO_Z$, $Ge_XSi_YN_Z$, and $Ge_WSi_XO_YN_Z$.

12. The RF switch of claim 11, wherein said heating element is transverse to said PCM and approximately underlying an active segment of said PCM.

13. The RF switch of claim 11, further comprising PCM contacts situated over passive segments of said PCM.

14. The RF switch of claim 11, further comprising another cladding dielectric layer situated over sides of said PCM.

15. The RF switch of claim 11, further comprising at least one contact uniformity support layer situated over said cladding dielectric layer, said at least one contact uniformity support layer comprising a material selected from the group consisting of silicon nitride ($Si_XN_Y$) and silicon oxide ($Si_XO_Y$).

16. A radio frequency (RF) switch comprising:
a heating element;
a thermally conductive and electrically insulating layer situated over said heating element;
a phase-change material (PCM) comprising at least germanium situated over said thermally conductive and electrically insulating layer;
a cladding dielectric layer comprising at least germanium situated over said PCM;
at least one contact uniformity support layer situated over said cladding dielectric layer.

17. The RF switch of claim 16, wherein said cladding dielectric layer comprises a material selected from the group consisting of germanium oxide ($Ge_XO_Y$), germanium nitride ($Ge_XN_Y$), germanium oxynitride ($Ge_XO_YN_Z$), germanium silicon oxide ($Ge_XSi_YO_Z$), germanium silicon nitride ($Ge_XSi_YN_Z$), and germanium silicon oxynitride ($Ge_WSi_XO_YN_Z$).

18. The RF switch of claim 16, further comprising another cladding dielectric layer situated over sides of said PCM.

19. The RF switch of claim 16, wherein said at least one contact uniformity support layer comprises a material selected from the group consisting of silicon nitride ($Si_XN_Y$) and silicon oxide ($Si_XO_Y$).

20. The RF switch of claim 13, wherein said heating element is transverse to said PCM such that said PCM contacts situated over said passive segments of said PCM do not overlie said heating element.

* * * * *